US009230857B2

(12) United States Patent
Hall et al.

(10) Patent No.: US 9,230,857 B2
(45) Date of Patent: Jan. 5, 2016

(54) METHOD TO IMPROVE SEMICONDUCTOR SURFACES AND POLISHING

(71) Applicants: International Business Machines Corporation, Armonk, NY (US); STMicroelectronics, Inc., Coppell, TX (US)

(72) Inventors: Lindsey H. Hall, Plano, TX (US); Michael Hatzistergos, Glenmont, NY (US); Ahmet S. Ozcan, Chappaqua, NY (US); Filippos Papadatos, Austin, TX (US); Yiyi Wang, Chappaqua, NY (US)

(73) Assignees: International Business Machines Corporation, Armonk, NY (US); St. Microelectronics Inc., Coppell, TX (US)

( * ) Notice: Subject to any disclaimer, the term of this patent is extended or adjusted under 35 U.S.C. 154(b) by 0 days.

(21) Appl. No.: 14/522,011

(22) Filed: Oct. 23, 2014

(65) Prior Publication Data
US 2015/0044869 A1    Feb. 12, 2015

Related U.S. Application Data

(62) Division of application No. 13/609,292, filed on Sep. 11, 2012.

(51) Int. Cl.
*H01L 21/768*   (2006.01)
*H01L 21/3213*  (2006.01)
*H01L 21/321*   (2006.01)

(52) U.S. Cl.
CPC .... *H01L 21/76877* (2013.01); *H01L 21/32115* (2013.01); *H01L 21/32135* (2013.01); *H01L 21/7684* (2013.01); *H01L 21/76831* (2013.01); *H01L 21/76871* (2013.01); *H01L 21/76892* (2013.01)

(58) Field of Classification Search
USPC .......................................................... 438/656
See application file for complete search history.

(56) References Cited

U.S. PATENT DOCUMENTS

| | | | |
|---|---|---|---|
| 5,600,182 A | 2/1997 | Schinella et al. |
| 5,804,249 A | 9/1998 | Sukharev et al. |
| 5,956,609 A | 9/1999 | Lee et al. |
| 6,211,082 B1 | 4/2001 | Yoo et al. |
| 6,383,821 B1 | 5/2002 | Young et al. |
| 6,498,095 B2 | 12/2002 | Matsuura |
| 6,579,788 B1 | 6/2003 | Jones et al. |

(Continued)

OTHER PUBLICATIONS

Tsai et al., "Layer tungsten and its applications for VLSI interconnects," International Electron Devices Meeting, IEDM '88, Technical Digest, 1988, pp. 462-465.
Ghyka, Office Action Communication for U.S. Appl. No. 13/609,292 dated Oct. 20, 2014, 11 pages.
Office Action for U.S. Appl. No. 13/609,292, dated Oct. 20, 2014, 11 pages.

(Continued)

*Primary Examiner* — Alexander Ghyka
(74) *Attorney, Agent, or Firm* — Steven J. Meyers; Hoffman Warnick LLC

(57) ABSTRACT

A method of forming a semiconductor device is disclosed. The method including providing a substrate with at least one insulating layer disposed thereon, the at least one insulating layer including a trench; forming at least one liner layer on the at least one insulating layer; forming a nucleation layer on the at least one liner layer; forming a first metal film on a surface of the nucleation layer; etching the first metal film; and depositing a second metal film on the etched surface of the first metal film, the second metal film substantially forming an overburden above the trench.

17 Claims, 10 Drawing Sheets

(56) References Cited

U.S. PATENT DOCUMENTS

| | | |
|---|---|---|
| 6,952,030 B2 | 10/2005 | Herner et al. |
| 7,300,867 B2 | 11/2007 | Gambino et al. |
| 7,405,154 B2 | 7/2008 | Cabral, Jr. et al. |
| 2002/0076924 A1 | 6/2002 | Koo |
| 2003/0054628 A1 | 3/2003 | Leng et al. |

OTHER PUBLICATIONS

Ghyka, Office Action Communication for U.S. Appl. No. 13/609,292, dateed May 1, 2015, 16 pages.

Ghyka, Office Action Communication for U.S. Appl. No. 13/609,292, dated Jun. 17, 2015, 14 pages.

Ghyka, Notice of Allowance and Fee(s) Due for U.S. Appl. No. 13/609,292, dated Oct. 7, 2015, 5 pages.

US 9,230,857 B2

METHOD TO IMPROVE SEMICONDUCTOR SURFACES AND POLISHING

FIELD OF THE INVENTION

Embodiments of this disclosure relate generally to semiconductor devices and, more particularly, to semiconductor device design, layout, and fabrication.

BACKGROUND

In the fabrication of integrated circuit (IC) devices (also referred to as semiconductor devices), many processes, steps, and techniques may be applied to form components and materials into the desired products. Some of these processes (e.g., chemical mechanical polishing (CMP), etc.) may be impacted by material grain size and the composition of surface layers. For example, in some IC devices low resistivity tungsten (W) films may be used as contact fill metals for various features and nodes. Creation of these films may include overburdens (e.g., a growth of a portion of the film beyond/above the patterned feature of the layer, an excess of material above a feature, etc.). These overburdens may include large material grain sizes which, depending on the material composition, texture, and thickness, may contribute to an overall roughness of the film. Films with a high overall roughness may be challenging to process (e.g., CMP) and may lead to non-uniformity, inconsistent performance, pattern density dependency, etc. Conventional approaches of minimizing the impact of these overburdens and/or processing the IC layers (e.g., limiting film thickness) fail to meet all design requirements and are deficient in producing the desired result.

BRIEF SUMMARY

A first aspect of the disclosure provides a method of forming a semiconductor device, the method including: providing a substrate with at least one insulating layer disposed thereon, the at least one insulating layer including a trench; forming at least one liner layer on the at least one insulating layer; forming a nucleation layer on the at least one liner layer; forming a first metal film on a surface of the nucleation layer; etching the first metal film; and depositing a second metal film on the etched surface of the first metal film, the second metal film substantially forming an overburden above the trench.

A second aspect of the disclosure provides a method of forming a semiconductor device, the method including: providing a substrate with at least one insulating layer disposed thereon, the at least one insulating layer including a trench; forming at least one liner layer on the at least one insulating layer; forming a nucleation layer on the at least one liner layer; forming a first metal film on a surface of the nucleation layer; forming an interface layer on the first metal film; and forming a second metal film on the interface layer, wherein the first metal film and the second metal film have substantially the same material composition.

A third aspect of the disclosure provides a method of forming a semiconductor device, the method including: forming at least one liner layer on an insulating layer of a semiconductor device, the insulating layer including a trench; forming a nucleation layer on the at least one liner layer; forming a first metal film on a surface of the nucleation layer; and forming an overburden on the first metal film by performing a low temperature deposition of a second metal film on the first metal film.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

The above and other aspects, features and advantages of the invention will be better understood by reading the following more particular description of the invention in conjunction with the accompanying drawings.

It is noted that the drawings of the disclosure are not necessarily to scale. The drawings are intended to depict only typical aspects of the disclosure, and therefore should not be considered as limiting the scope of the disclosure. It is understood that elements similarly numbered between the FIGURES may be substantially similar as described with reference to one another. Further, in embodiments shown and described with reference to FIGS. 1-19, like numbering may represent like elements. Redundant explanation of these elements has been omitted for clarity. Finally, it is understood that the components of FIGS. 1-19 and their accompanying descriptions may be applied to any embodiment described herein.

DETAILED DESCRIPTION

Figure 1:
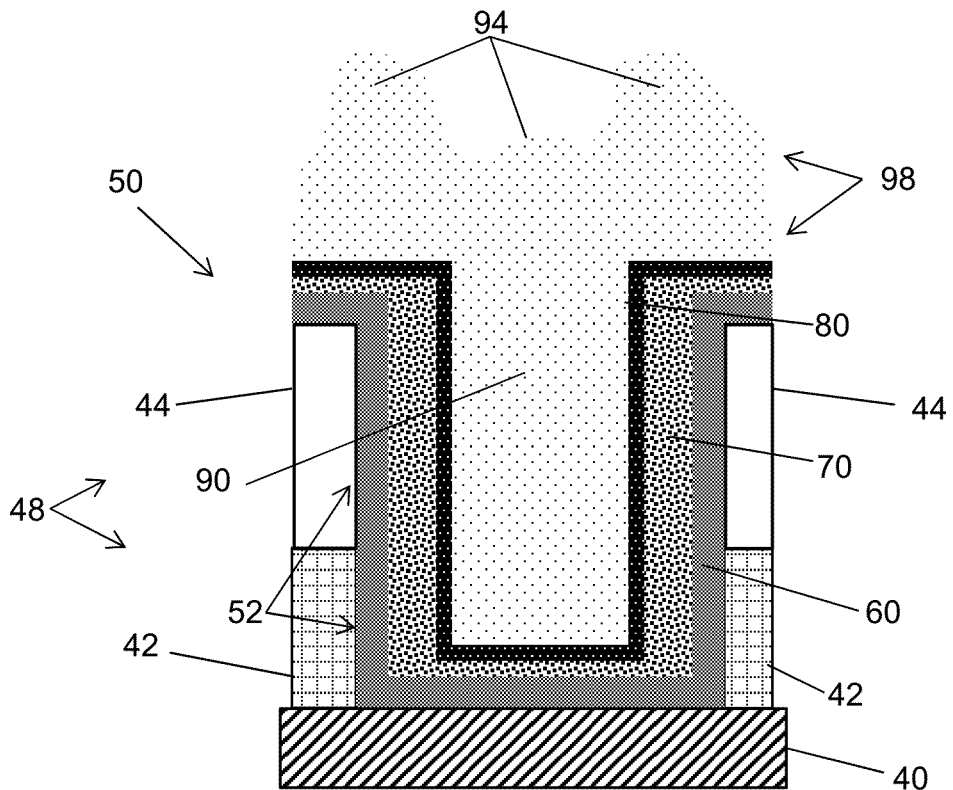
FIG. 1 is a demonstrative illustration of a portion of a semiconductor device.

FIG. 1 is a demonstrative illustration of a cross sectional view of a portion of a known semiconductor device 50 including a trench 52. Semiconductor device 50 may include a substrate 40 upon which at least one insulating layer 48 is disposed partially defining trench 52. The at least one insulating layer may include an oxide and/or nitride stack. Oxide and/or nitride stack 48 may include a nitride layer 42 (e.g., nitride, silicon nitride, etc.) and an oxide layer 44. Trench 52 is formed in oxide and/or nitride stack 48. A first liner (e.g., barrier liner, glue liner, etc.) layer 60 and a second liner layer 70 may be disposed (e.g., formed, deposited, etc.) on semiconductor device 50 and within trench 52. Liner layers 60 and 70 may include titanium and/or titanium nitride, and may substantially cover a surface of substrate 40. A nucleation (e.g., seed) layer 80 (e.g., tungsten) may be disposed on second liner layer 70, covering a surface thereof. During fabrication of semiconductor device 50, trench 52 and/or a portion of nucleation layer 80 may be covered with a metal film/layer 90 (e.g., a tungsten (W) film). As can be seen, deposition of metal film 90 may fill trench 52 and extend beyond a surface of nucleation layer 80 forming an overburden 98 (e.g., a growth of a portion of the film beyond/above the patterned feature of the layer, an excess of material above a feature, etc.). Overburden 98 includes a set of peaks/ridges 94 formed by a large grain size of metal film 90 during development. Peaks/ridges 94 may impact some of the manufacturing processes (e.g., Chemical Mechanical Processing (CMP)) which follow. This may in turn adversely affect the chip topography. It is understood that metal film 90 may include a plurality of metals and materials, and that the examples listed herein are merely exemplary.

Figure 2:
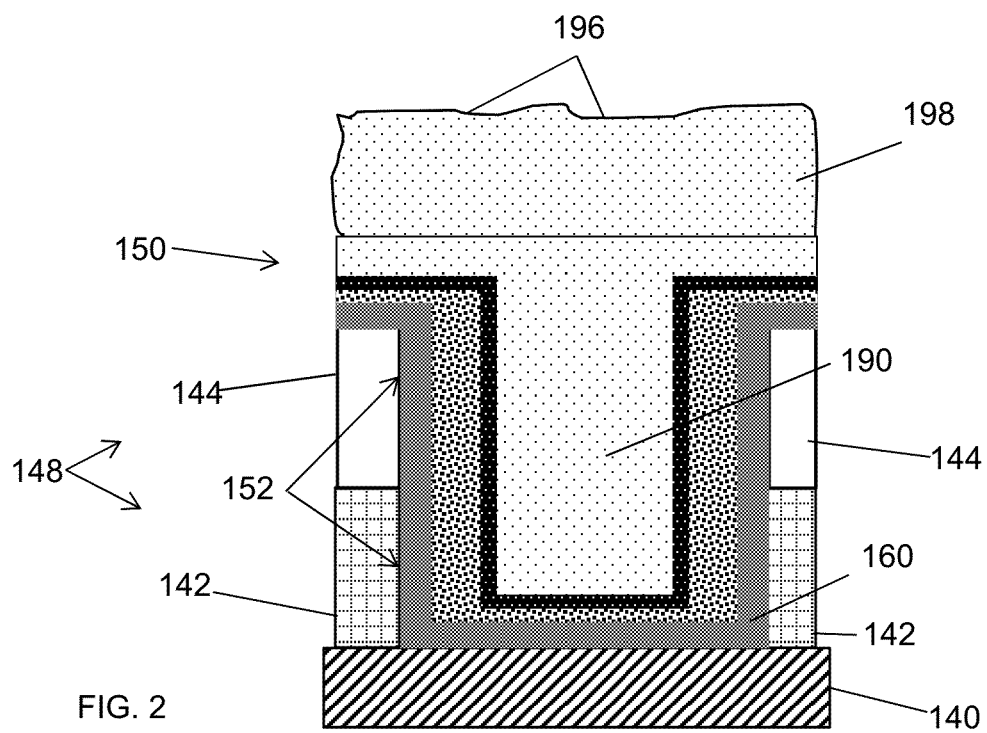
FIG. 2 is a demonstrative illustration of a graphical representation of a profile of a portion of a semiconductor device according to an embodiment of the invention.

Turning to FIG. 2, a demonstrative illustration of a cross sectional view of a portion of a semiconductor device 150 is shown including a trench 152 formed on a substrate 140 in an insulating layer 148 (e.g., an oxide and/or nitride stack, a dielectric, etc.) set of layers according to embodiments. The set of layers may include a nitride layer 142 and an oxide layer 144. Trench 152 may be filled with a metal layer 190 (e.g., tungsten) and include an overburden 198 with a substantially uniform (e.g., smooth) overburden surface 196 formed in accordance with methods described herein. It is understood that embodiments are described herein with reference to specific substrates and layer orientations/compositions for exemplary purposes, and that any combination of layers (e.g., oxide and nitride layers and configurations), substrate modifications (e.g., formation of trench 152 in substrate 140) and/or trench placements may be included as an embodiment of the invention. The trenches, layers, and/or overburdens described herein may be formed in substrates and/or layers which are substantially similar and/or different to those described and shown in FIGS. 1 and 2.

FIGS. 3-6 are demonstrative illustrations of a device undergoing a method according to embodiments of the invention. Although FIGS. 3-6 show the method of forming a portion of a semiconductor device 250 shown in FIG. 6, it is understood that a similar method may be employed to form any other like semiconductor device.

Figure 3:
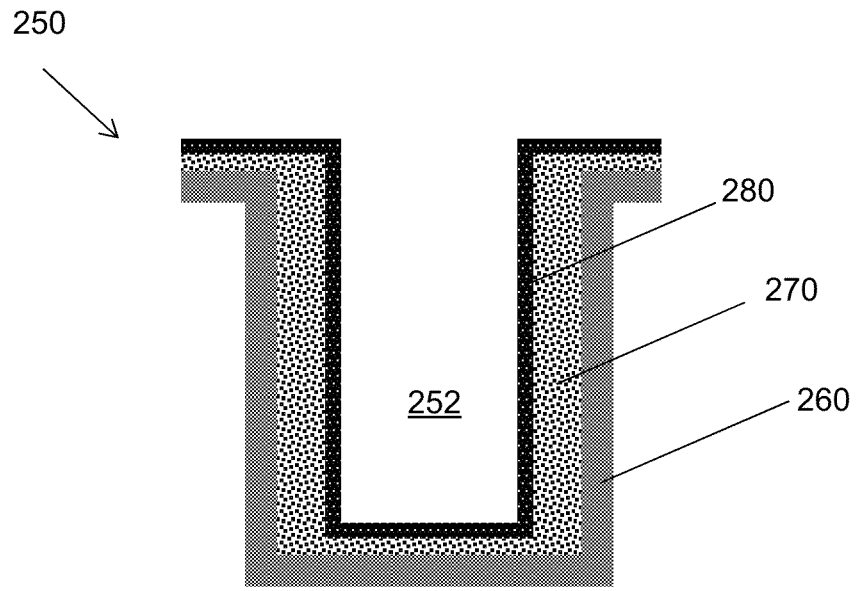
FIGS. 3-6 are demonstrative illustrations of a method of forming a semiconductor device according to embodiments of the invention.

Turning to FIG. 3, a demonstrative illustration of a trench 252 in a semiconductor device 250 is shown in preparation for deposition of layers. In one embodiment, trench 252 may be formed (e.g., etched) on substrate 140 and/or in a set of layers (e.g., nitride (e.g., SiN) and/or oxide films, etc.) thereon as described herein. Trench 252 may be etched using any now known or later developed etching techniques. In one embodiment, etching of trench 252 may be performed using a reactive ion etch (RIE). As is known in the art of semiconductor fabrication, RIE uses chemically reactive plasma to remove material deposited on wafers/substrates. Differences in width between these openings may allow for utilizing a phenomenon known as inverse RIE lag. Inverse RIE lag, as is known in the art of semiconductor fabrication, causes a faster etch rate in narrower openings (higher aspect ratios) than in openings having larger widths (lower aspect ratios). Inverse RIE lag may be induced under any conditions characterized by high polymerization and high wafer self-bias voltages. In one embodiment, conditions characterized by high polymerization, may include general chemistries such as CxHyFz (Carbon-Hydrogen-Flourine) with high oxide-to-nitride selectivity (where the blanket etch rate ratio is greater than approximately 20:1). In another embodiment, conditions characterized by high polymerization may include $O_2$ (oxygen), a dilutant, and one or more of: $C_4F_6$, $C_5F_8$, or $C_4F_8$. In this case, the dilutant may be, for example, Argon (Ar). High wafer self-bias voltages may, for example, be voltages greater than approximately 500 volts. While specific conditions for facilitating inverse RIE lag are described herein, those conditions are merely illustrative. Inverse RIE lag may be induced under other conditions not specifically described herein.

In any event, semiconductor device 250 may include a second liner layer 270 (e.g., titanium nitride) disposed on and/or above a first liner layer 260 (e.g., titanium) and within trench 252. A nucleation layer 280 may be disposed on a surface of second liner layer 270 and configured to support growth of a first metal film thereon.

Figure 4:
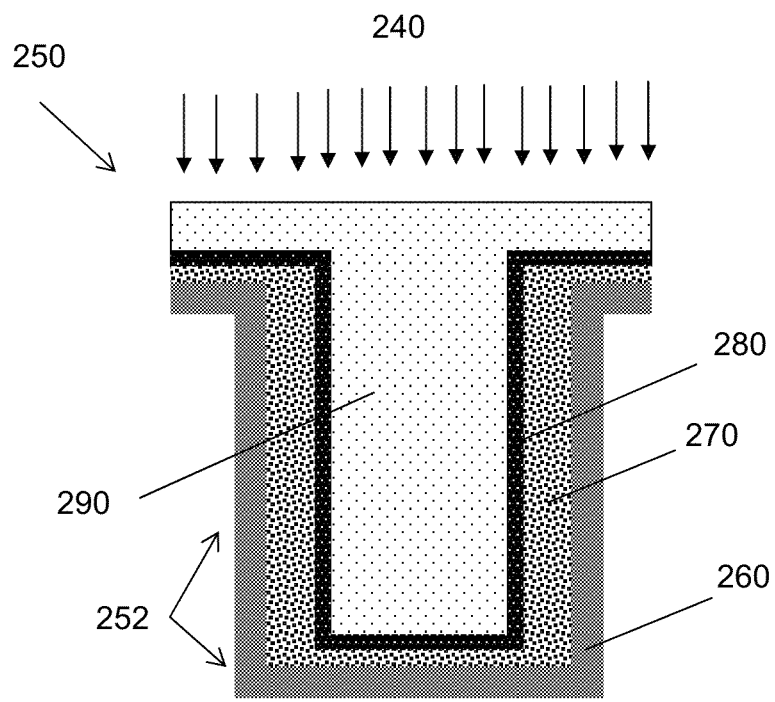

Next, in FIG. 4, a demonstrative illustration of formation/deposition of a first metal film 290 on nucleation layer 280 and/or within trench 252 is shown in accordance with embodiments. In this embodiment, a deposition 240 forms first metal film 290 upon nucleation layer 280. First metal film 290 may fill trench 252 and begin to extend beyond a surface of nucleation layer 280. In one embodiment, deposition 240 may be stopped once trench 252 has been filled and prior to development of an overburden 298 (shown in FIG. 6).

Figure 5:
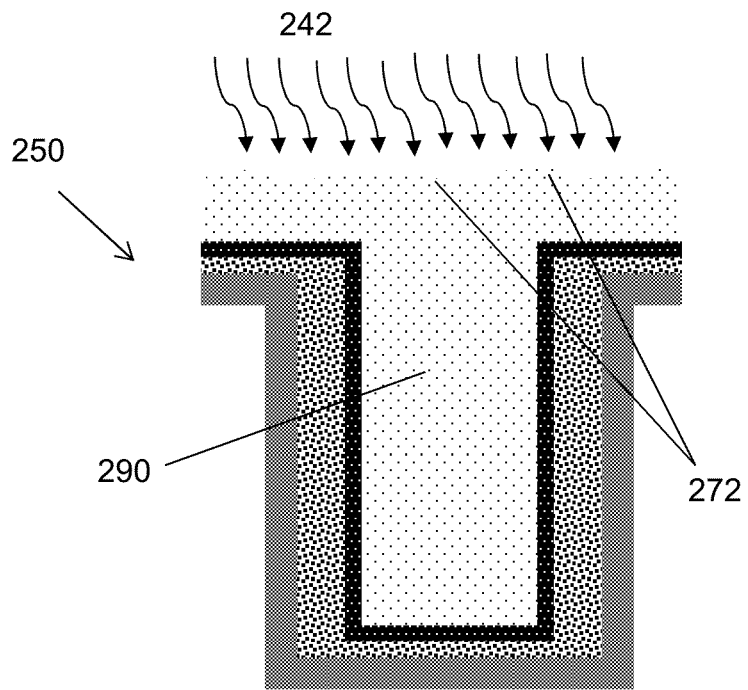

Next, in FIG. 5, a demonstrative illustration is shown where semiconductor device 250 is subjected to an etch 242 following cessation of deposition 240 in accordance with embodiments. Once deposition 240 has stopped, etch 242 may be applied to a surface 272 (e.g., first metal film 290) of semiconductor device 250. In one embodiment, etch 242 may comprise a mild etch (e.g., a low power etch that has high selectivity to material 290 and etches at least about 10 Angstroms of the material). In one embodiment, etch 242 may include a fluorine based etch. Etch 242 may reset/adjust a material characteristic and/or a growth characteristic (e.g., reset nucleation for creation of overburden 298 (shown in FIG. 6), change surface morphology or nucleation characteristics, decrease starting grain size for overburden 298, manipulate grain surfaces on first metal film 290, etc.) of first metal film 290 and/or overburden 298. In an embodiment, etch 242 may substantially smooth (e.g., make uniform) surface 272 of first metal film 290, thereby forming a surface for creation of overburden 298 which is substantially uniform and/or resets grain growth for overburden 298 relative grains in first metal film 290.

Figure 6:
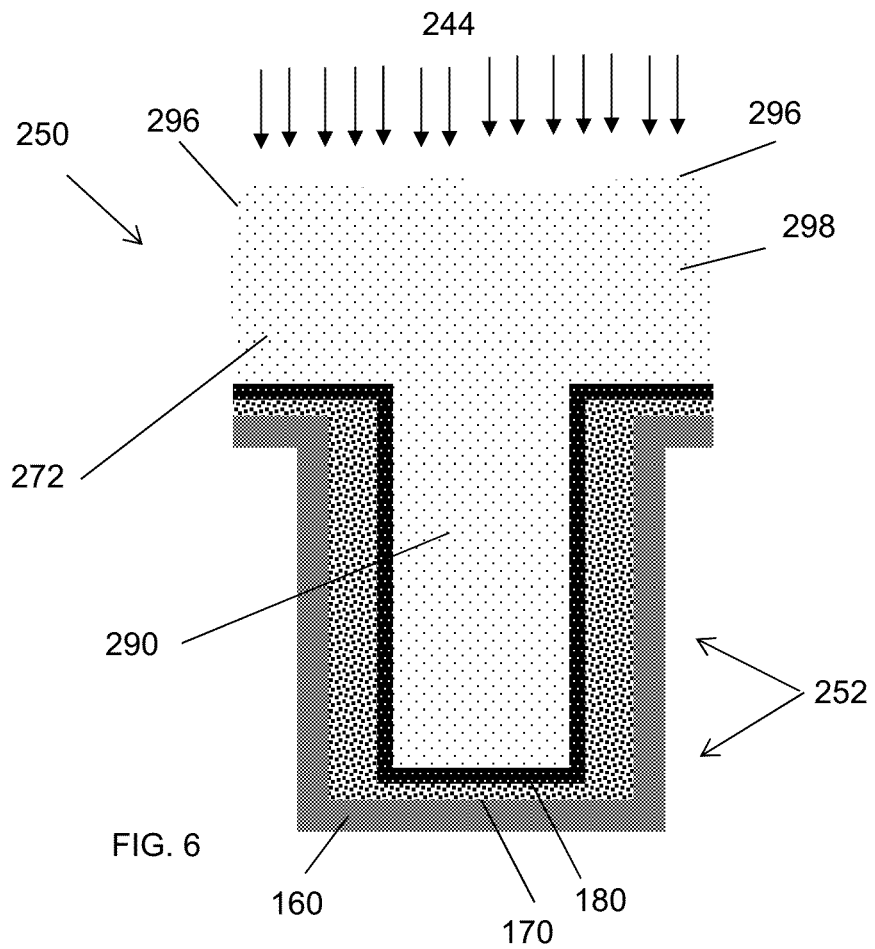

Turning now to FIG. 6, following etch 242, a second deposition 244 of a second metal layer/overburden 298 is shown being applied to semiconductor device 250 in accordance with embodiments. Second deposition 244 may substantially form an overburden 298 on semiconductor device 250 and/or above trench 252. In one embodiment, deposition 244 may be applied directly on a first surface 272 of first deposition 240. In one embodiment, second deposition 244 may include a different material composition (e.g., metal, metallic combination, etc.) relative first deposition 240. In one embodiment, second deposition 244 may restart growth of first metal film 290 from first surface 272 resulting in a smaller grain size for first metal film 290 and/or overburden 298. In one embodiment, a surface 296 of overburden 298 may be substantially smooth/uniform.

As used herein, the term "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser-assisted deposition, thermal oxidation, thermal nitridation, spin-on methods, physical vapor deposition (PVD), atomic layer deposition (ALD), plasma enhanced atomic layer deposition (PEALD), chemical oxidation, molecular beam epitaxy (MBE), plating, evaporation, etc.

First liner layer 260 and/or second liner layer 270 may include any commonly used dielectric material including but not limited to polysilicon or high melting point refractory metals, such as W, Ti, Ta, Mo, Nb, Re, Ru and their binary or ternary metallic derivatives, e.g., WN, TiN, TaN, MoN, MoO2, TaSiN. First liner layer 260 and/or second liner layer 270 may comprise any commonly used gate dielectric material including but not limited to oxide, nitride, oxynitride, and high-k materials such as hafnium silicate, zirconium silicate, hafnium dioxide, and zirconium dioxide. Further, first liner layer 260 and/or second liner layer 270 may include silicon dioxide ($SiO_2$), silicon nitride (SiN), or any other material now known or later developed. Any number of dielectric regions may be located over the substrate, as many other layers included in semiconductor chips now known or later developed. In one embodiment, first liner layer 260 and/or second liner layer 270 may include silicon dioxide ($SiO_2$) for its insulating, mechanical and optical qualities. First liner layer 260 and/or second liner layer 270 may also include, but is not limited to: silicon nitride ($Si_3N_4$), fluorinated $SiO_2$ (FSG), hydrogenated silicon oxycarbide (SiCOH), porous SiCOH, boro-phosho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

Substrate 140 can comprise any commonly used substrate material including but not limited to silicon, germanium, silicon germanium, silicon carbide, and those consisting essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Substrate 140 may also be comprised of Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The processes to provide substrate 140, as illustrated and described, are well known in the art and thus, no further description is necessary.

Figure 7:
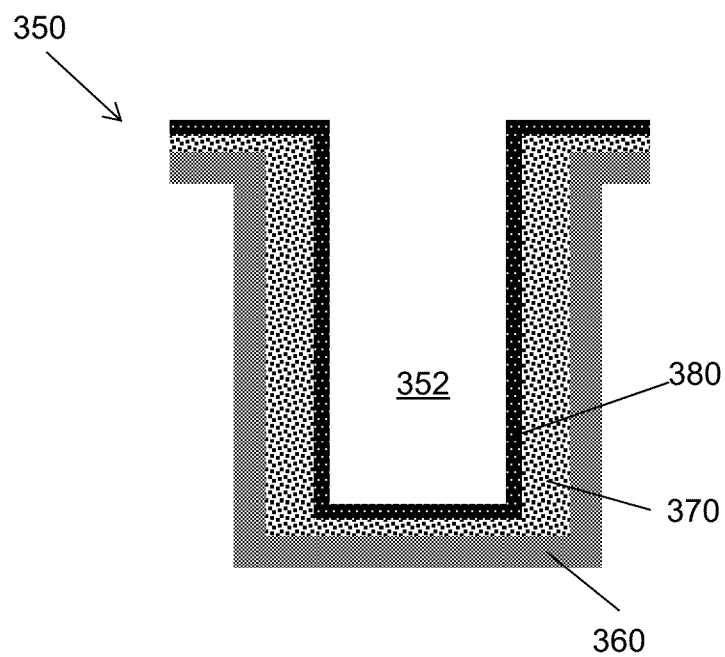
FIGS. 7-9 are demonstrative illustrations of a method of forming a semiconductor device according to embodiments of the invention.
Figure 8:
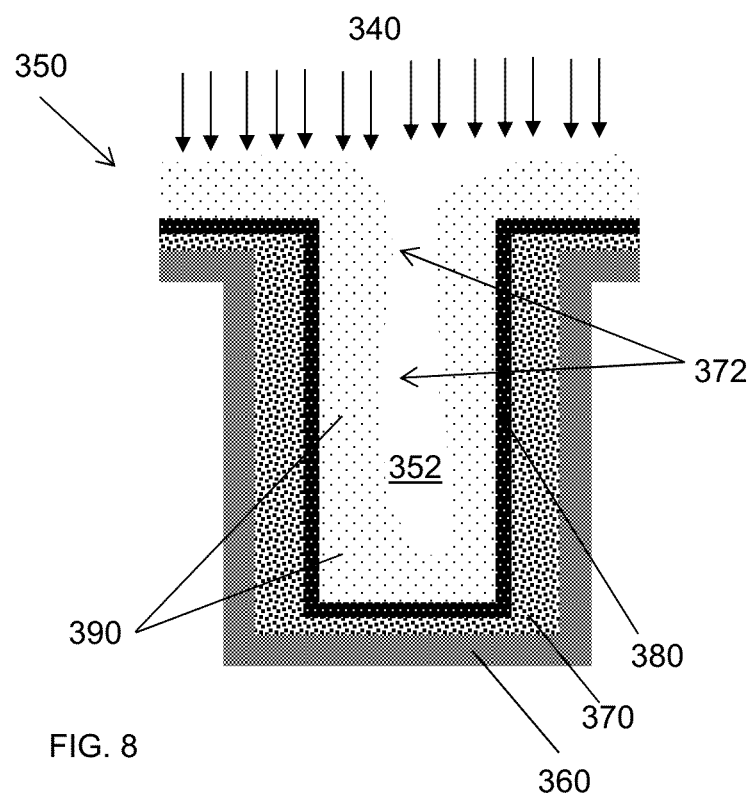
Figure 9:
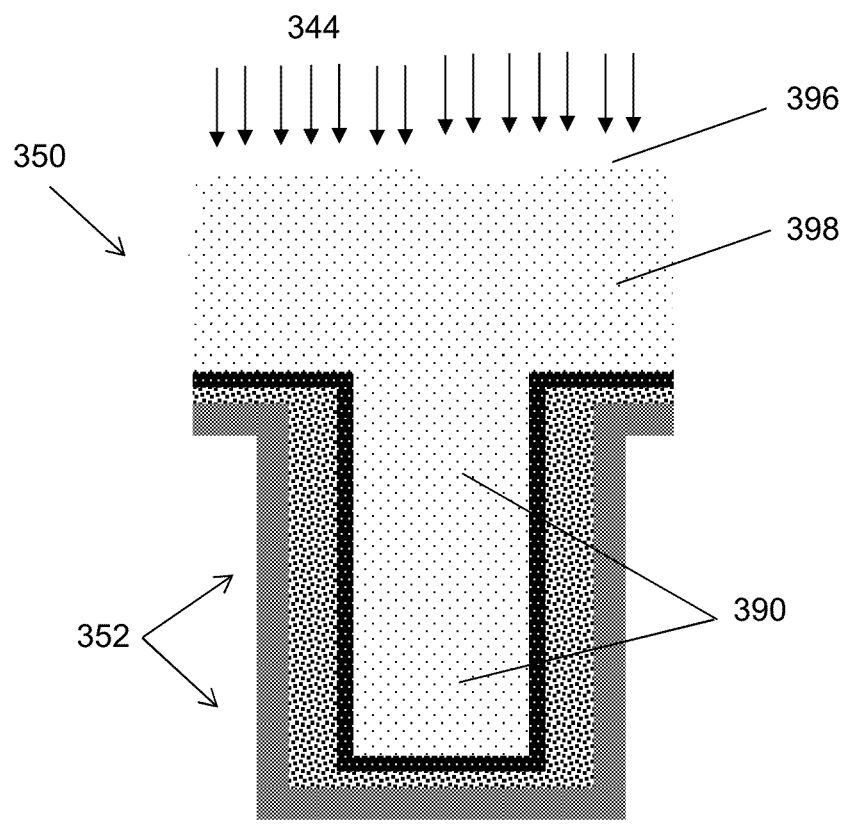
Figure 10:
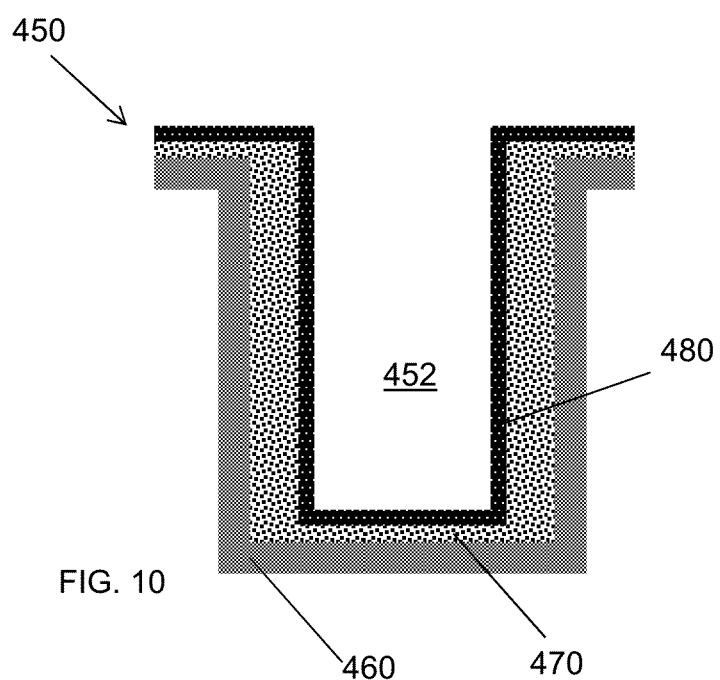
FIGS. 10-14 are demonstrative illustrations of a method of forming a semiconductor device according to embodiments of the invention.

FIGS. 7-9 are demonstrative illustrations of a semiconductor device 350 undergoing processes according to a method in accordance with another embodiment of the invention. In this method a low temperature (e.g., less than about 300 degrees Celsius) deposition 344 forms a portion of a metal layer 390 on semiconductor device 350. Although FIGS. 7-9 are demonstrative illustrations of the method of forming a portion of semiconductor device 350 in FIG. 9, it is understood that a similar method may be employed to form any other like semiconductor device.

Turning to FIG. 7, a demonstrative illustration of a trench 352 in a semiconductor device 350 is shown in preparation for deposition of layers. In one embodiment, a trench 352 may be formed (e.g., etched) on and/or above substrate 140. As discussed herein, trench 452 may be etched using any now known or later developed etching techniques.

In any event, semiconductor device 350 may include a second liner layer 370 disposed on and/or above a first liner layer 360 and within trench 352. A nucleation layer 380 may be disposed on a surface of second liner layer 370 and configured to support growth of a film/metal layer thereon.

Next, in FIG. 8, a demonstrative illustration of formation/deposition of a first metal film 390 on nucleation layer 380 and/or within trench 352 is shown in accordance with embodiments. In one embodiment, first metal film 390 may have a thickness less than half of the minimum width of the trench and/or just enough to fill the trench. In this embodiment, a partial deposition 340 forms first metal film 390 upon nucleation layer 380. First metal film 390 partially fills trench 352 and extends beyond a surface of seed/nucleation layer 380. In one embodiment, partial deposition 340 may leave a portion of trench 352 unfilled (shown in FIG. 8).

Turning now to FIG. 9, following partial deposition 340, a low temperature deposition 344 of a second metal layer/overburden 398 is shown being applied to semiconductor device 350 in accordance with embodiments. Second deposition 344 may substantially form an overburden 398 on semiconductor device 350 and/or above trench 352. Overburden 398 may have a small material grain size relative a grain size in first metal film 390. In one embodiment, low temperature deposition 344 may be applied directly on a first surface 372 (shown in FIG. 8) of first layer 390. In one embodiment, low temperature deposition 344 may include a different material composition (e.g., metal, metallic combination, etc.) relative first deposition 340. In one embodiment, low temperature deposition 344 may restart growth of first metal film 390 from first surface 372 resulting in a smaller grain size for first metal film 390 and/or overburden 398. In one embodiment, a surface 396 of overburden 398 may be substantially smooth/uniform. Low temperature deposition 344 may reduce grain size in first metal film 390.

FIGS. 10-14 are demonstrative illustrations of a semiconductor device 450 undergoing processes according to a method in accordance with another embodiment of the invention. In this method an etch 442 and a low temperature deposition 444 may be included in fabrication of semiconductor device 450. Although FIGS. 10-14 are demonstrative illustrations of the method of forming a portion of semiconductor device 450 in FIG. 14, it is understood that a similar method may be employed to form semiconductor device 150 of FIG. 2, or any other like semiconductor device.

Returning to FIG. 10, a demonstrative illustration of a cross-sectional view of semiconductor device 450 undergoing a process according to embodiments is shown. In one embodiment, a trench 452 may be etched on and/or above substrate 140. As discussed herein, trench 452 may be etched using any now known or later developed etching techniques. Semiconductor device 450 may include a second liner layer 470 disposed on a surface of a first liner layer 460 and within trench 452. A nucleation layer 480 may be disposed on a surface of second liner layer 470 and configured to support growth of a film/metal layer thereon.

Figure 11:
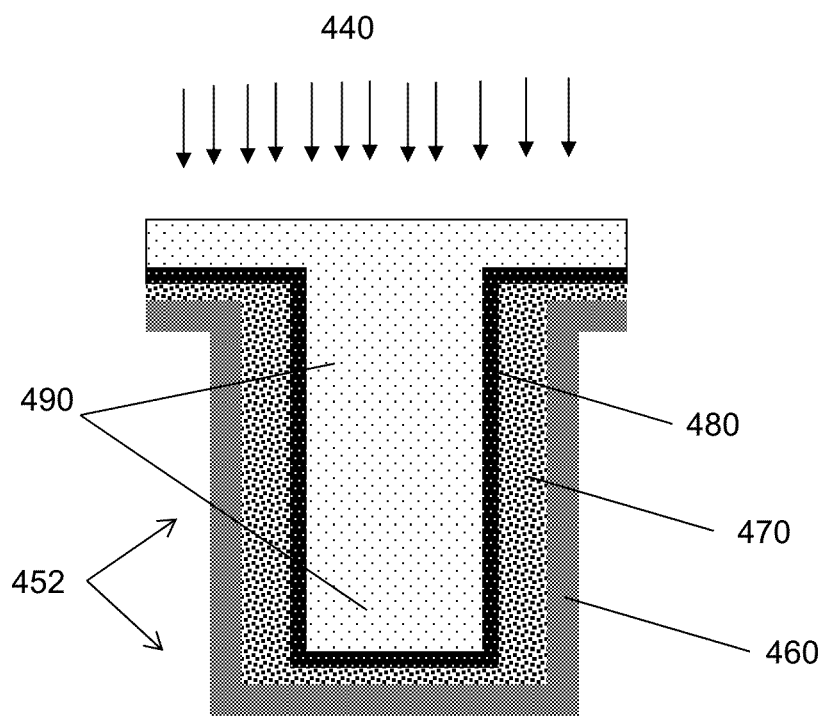

Next, in FIG. 11, a demonstrative illustration of formation/deposition of a first metal film 490 on nucleation layer 480 and/or within trench 452 is shown in accordance with embodiments. In this embodiment, a first deposition 440 forms first metal film 490 upon nucleation layer 480. First metal film 490 may fill trench 452 and begin to extend beyond a surface of seed/nucleation layer 480. In one embodiment, first deposition 440 may be stopped once trench 452 has been filled and prior to development of an overburden 498 (shown in FIG. 14).

Figure 12:
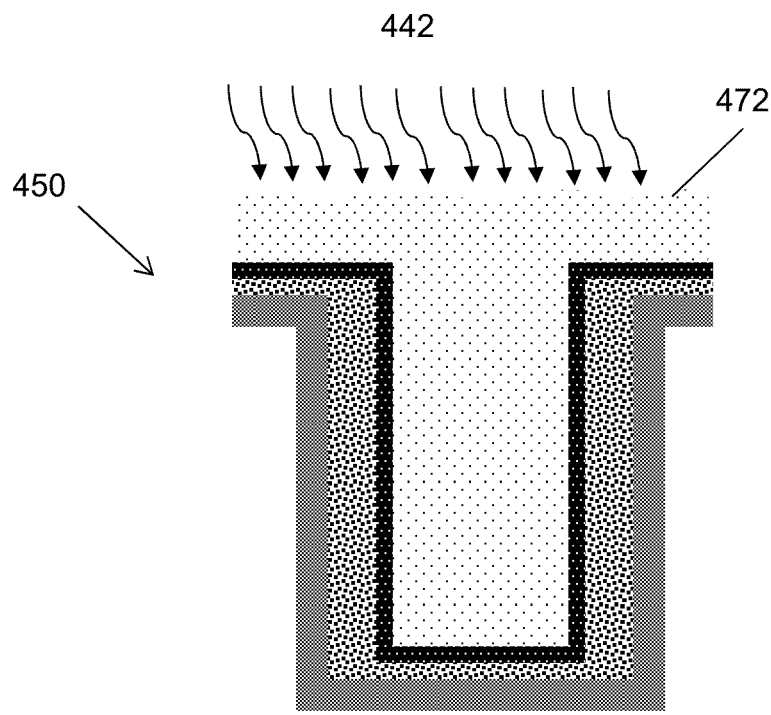

Next, in FIG. 12, a demonstrative illustration is shown where semiconductor device 450 is subjected to an etch 442 following cessation of first deposition 440 in accordance with embodiments. Once first deposition 440 has stopped, etch 442 may be applied to a surface 472 (e.g., metal film 490) of semiconductor device 450. In one embodiment, etch 442 may comprise a mild etch (as discussed herein). In one embodiment, etch 442 may include a fluorine based etch. Etch 442 may substantially smooth (e.g., make uniform) a surface 472 of first metal film 490. Etch 442 may reset/adjust a material characteristic and/or a growth characteristic (e.g., reset nucleation for creation of overburden 498 (shown in FIG. 13), change surface morphology or nucleation characteristics, decrease starting grain size for overburden 498, manipulate grain surfaces on first metal film 490, etc.) of first metal film 490 and/or overburden 498. In an embodiment, etch 442 may substantially smooth (e.g., make uniform) a surface of first metal film 490, thereby forming a surface for creation of overburden 498 which is substantially uniform and/or resets grain growth for overburden 498 relative grains in first metal film 490.

Figure 13:
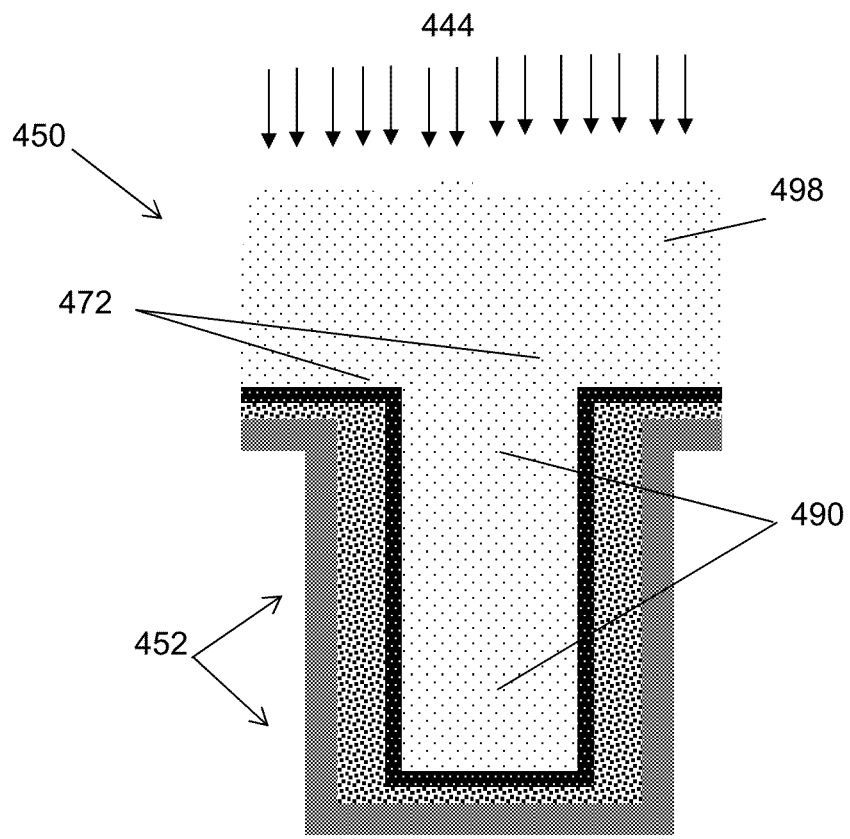
Figure 14:
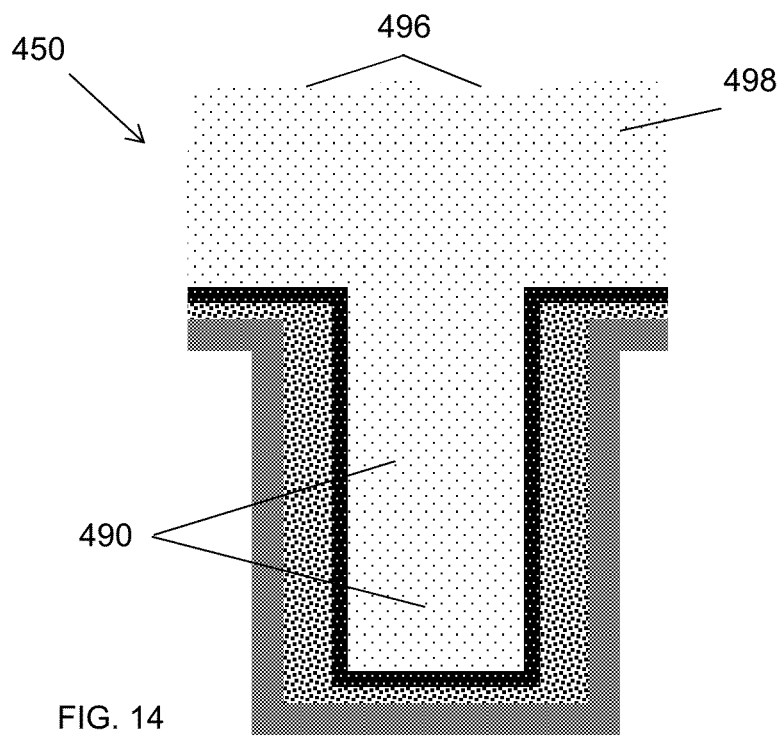

Turning now to FIG. 13, following etch 442, a low temperature deposition 444 of first metal layer 490 is shown being applied to semiconductor device 450 following etch 442 in accordance with embodiments. Low temperature deposition 444 may substantially form an overburden 498 on semiconductor device 450 and/or above trench 452. Overburden 498 may have a small material grain size relative a grain size in first metal film 490. In one embodiment, low temperature deposition 444 may be applied directly on first surface 472 of first deposition 440. In one embodiment, low temperature deposition 444 may include a different material composition (e.g., metal, metallic combination, etc.) relative first deposition 440. In one embodiment, low temperature deposition 444 may restart growth of first metal layer 490 from first surface 472 resulting in a smaller grain size for first metal film 490. As can be seen in FIG. 14, following low temperature deposition 444, a surface 496 of overburden 498 may be substantially smooth/uniform. Low temperature deposition may reduce grain size in first metal film 490.

FIGS. 15-18 are demonstrative illustrations of a semiconductor device 550 undergoing processes according to a method in accordance with another embodiment of the invention. In this embodiment, an interface layer 586 (e.g., a thin liner film, titanium nitride, etc.) is formed as a layer of semiconductor device 550. Although FIGS. 15-18 are demonstrative illustrations of the method of forming a portion of semiconductor device 550 in FIG. 18, it is understood that a similar method may be employed to form any other like semiconductor device.

Figure 15:
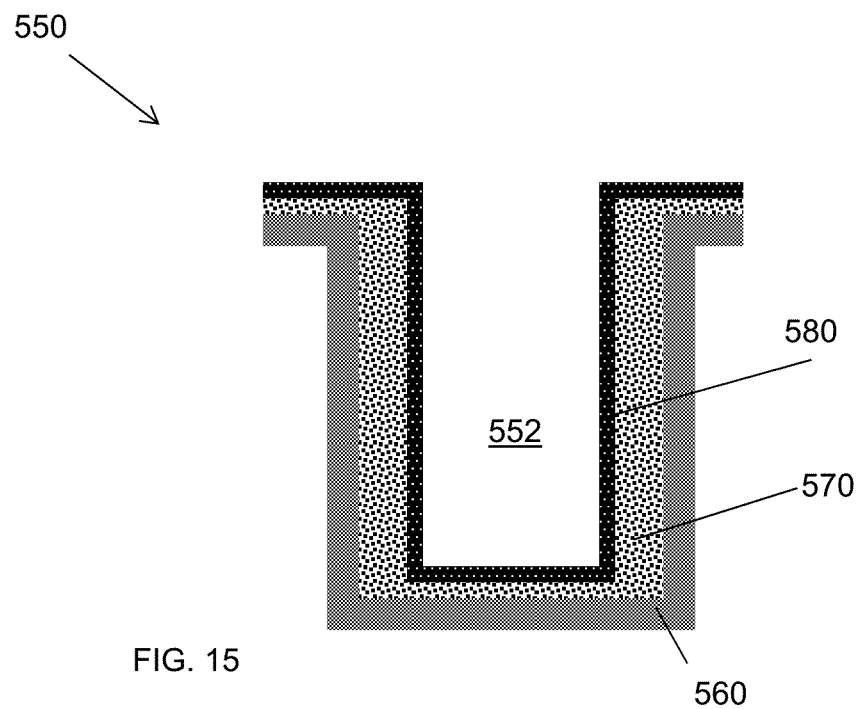
FIGS. 15-18 are demonstrative illustrations of a method of forming a semiconductor device according to embodiments of the invention.

Turning to FIG. 15, a demonstrative illustration of a trench 552 in a semiconductor device 550 is shown in preparation for deposition of layers. In one embodiment, trench 552 may be formed (e.g., etched) on and/or above substrate 140. As discussed herein, trench 552 may be formed using any now known or later developed techniques. Semiconductor device 550 may include a second liner layer 570 disposed on a first liner layer 560 and within trench 552. A nucleation layer 580 may be disposed on a surface of second liner layer 570 and configured to support growth of a film/metal layer thereon.

Figure 16:
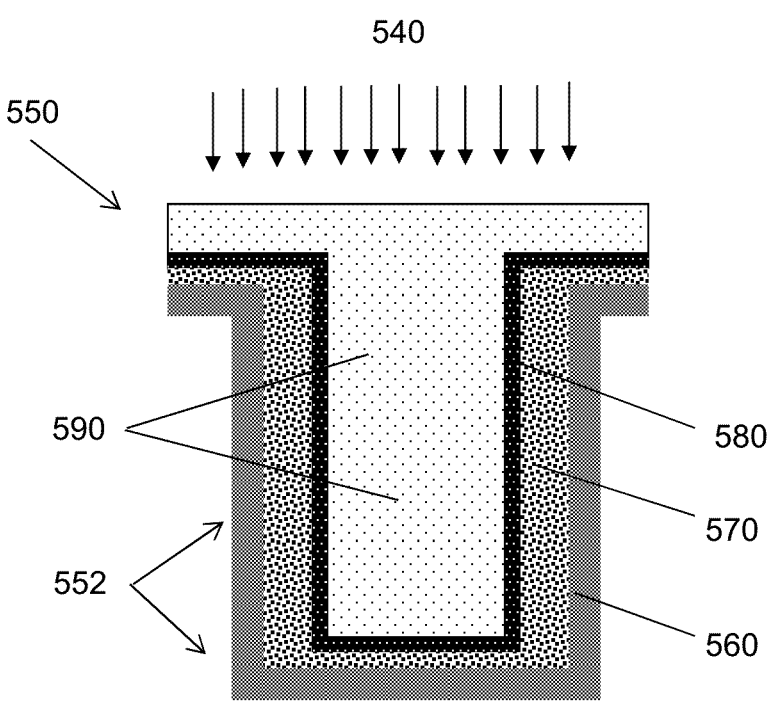

Next, in FIG. 16, a demonstrative illustration of formation/deposition of a first metal film 590 on nucleation layer 580 and/or within trench 552 is shown in accordance with embodiments. In this embodiment, a first deposition 540 forms first metal film 590 upon nucleation layer 580. First metal film 590 may fill trench 552 and begin to extend beyond a surface of seed layer 580. In one embodiment, first deposition 540 may be stopped once trench 552 has been filled and prior to development of an overburden 598 (shown in FIG. 18).

Figure 17:
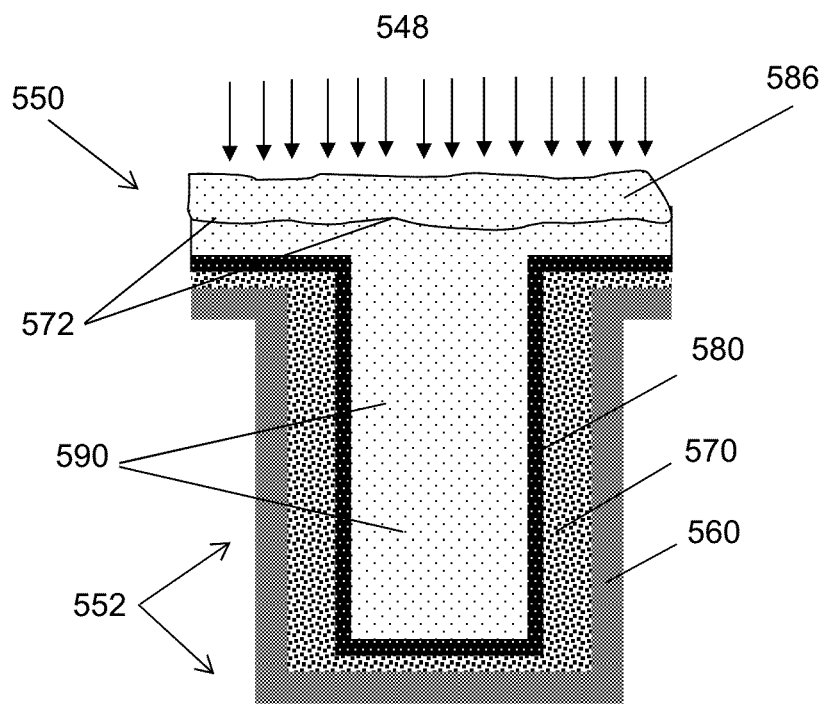

Turning now to FIG. 17, following first deposition 540 and formation of surface 572, an interface deposition 548 of an interface layer 586 is shown being applied to surface 572 in accordance with embodiments. Interface layer 586 may be formed by an interface deposition 548 and may include a thin film (e.g., liner, titanium nitride, nucleation layer, etc.). Interface layer 586 may substantially smooth (e.g., make uniform) a surface 572 of first metal film 590. Interface layer 586 may reset/adjust a material characteristic and/or a growth characteristic (e.g., reset nucleation for creation of overburden 598 (shown in FIG. 18), change surface morphology or nucleation characteristics, decrease starting grain size for overburden 598, manipulate grain surfaces on first metal film 590, etc.) of first metal film 590 and/or overburden 598. In an embodiment, interface layer 586 may substantially smooth (e.g., make uniform) a surface of first metal film 590, thereby forming a surface for creation of overburden 598 which is substantially uniform and/or resets grain growth for overburden 598 relative grains in first metal film 590. In one embodiment, interface layer 586 may be about 10 nm to about 20 nm thick. In one embodiment, interface deposition 548 may be applied directly on first surface 572 of first deposition 540. Interface deposition 548 may substantially cover metal film 590 and/or serve as a base to reset the nucleation process of future metal films.

Figure 18:
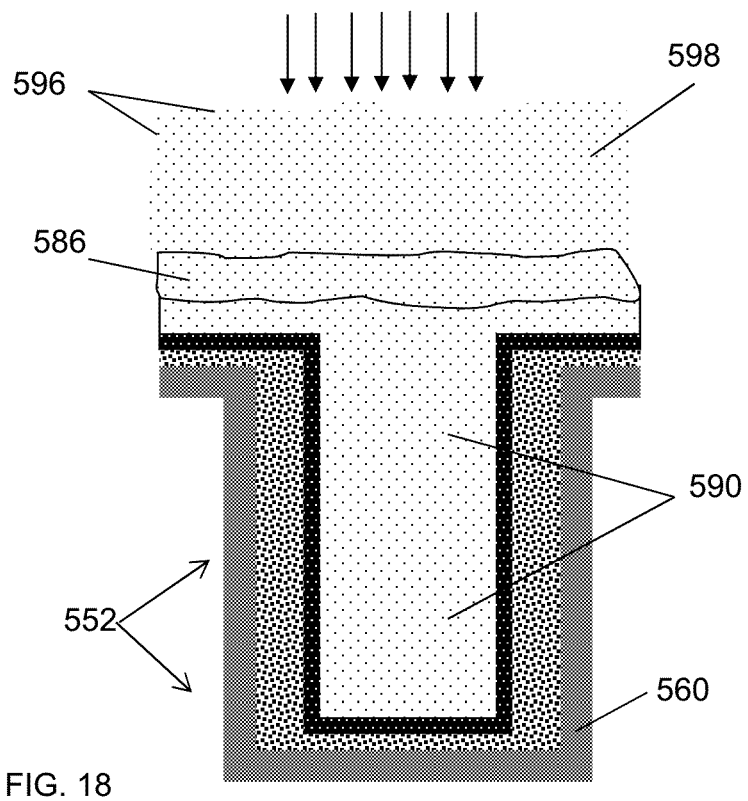

Turning now to FIG. 18, following interface deposition 548, a second deposition 544 of an overburden 598/second metal layer is shown being applied to semiconductor device 550 in accordance with embodiments. Second deposition 544 may substantially form an overburden 598 on semiconductor device 550 and/or above trench 552. In one embodiment, second deposition 544 may be applied directly on interface layer 586. In one embodiment, second deposition 544 may include a different material composition (e.g., metal, metallic combination, etc.) relative first deposition 540. In one embodiment, second deposition 544 may restart growth of metal layer 590 from interface layer 586 with a new nucleation layer resulting in a smaller grain size for metal film 590. In one embodiment, a surface 596 of overburden 598 may be substantially smooth/uniform.

Figure 19:
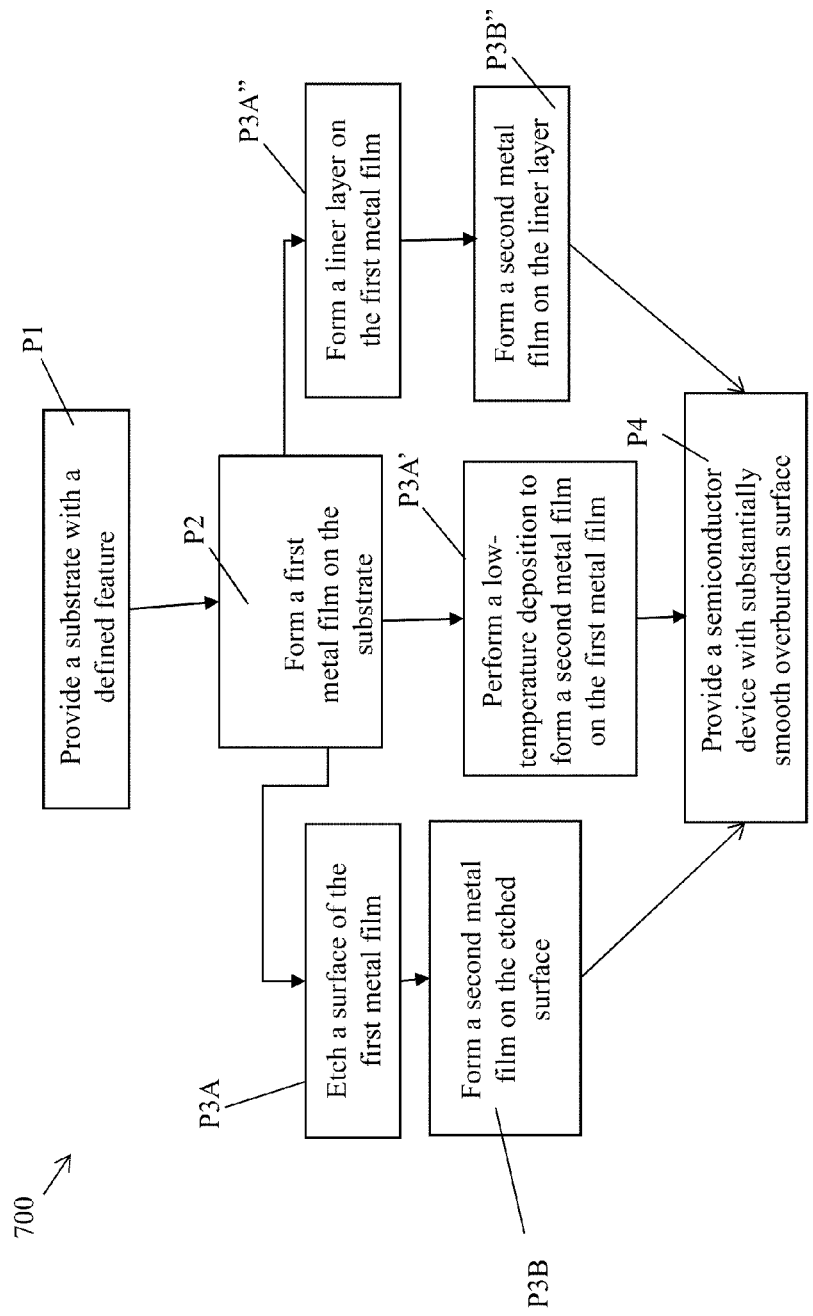
FIG. 19 is a demonstrative illustration of a method flow diagram illustrating steps in a method of fabricating a semiconductor device in accordance with an embodiment.

Turning to FIG. 19, a demonstrative method flow diagram 700 is shown illustrating a process according to aspects of the invention. In this embodiment, method flow diagram 700 includes a method for forming an overburden with a substantially smooth surface on a semiconductor device. In process P1, a substrate is provided with a defined feature (e.g., a trench, a contact, etc.) thereon (e.g., formed in the substrate, formed in layers on the substrate, etc.). Following process P1, in process P2 a first metal film may be formed on the substrate and/or layers above the substrate. In one embodiment, the first metal film may cover and/or fill the feature. Following process P2, in one embodiment, at Process P3A, a surface of the first metal film may be etched. Next, in process P3B, a second metal film may be formed on the etched surface to develop an overburden. Alternatively, following process P2, in process P3A' following formation of the first metal film, a low temperature deposition of a second metal film may be performed directly on the first metal film to form an overburden. In another embodiment, in process P3A" following formation of the first metal film, an interface/liner layer may be formed/deposited on a surface of the first metal layer. Following process P3A" in process P3B" a second metal film may be formed directly on the interface/liner layer to create an overburden on the substrate and above the feature.

In any event, following either of process P3B, process P3A' or process P3B", in process P4, a semiconductor device including an overburden with a substantially smooth surface may be provided.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a semiconductor device, the method comprising:
   providing a substrate with at least one insulating layer disposed thereon, the at least one insulating layer including a trench;
   forming at least one liner layer on the insulating layer;
   forming a nucleation layer on the at least one liner layer;
   forming a first metal film on a surface of the nucleation layer to fill the trench; and
   depositing a second metal film directly onto the first metal film, above an upper surface of the substrate and an upper surface of the trench to yield an overburden above the trench, the overburden including the second metal film positioned over and contacting the first metal film, wherein a material grain size of the second metal film is less than a material grain size of the first metal film.

2. The method of claim 1, wherein the first metal film and the second metal film have a substantially similar material composition.

3. The method of claim 1, wherein the first metal film and the second metal film are substantially tungsten.

4. The method of claim 1, the method further comprising:
   etching the first metal film,
   wherein depositing the second metal film includes depositing the second metal film on the etched surface of the first metal film.

5. The method of claim 1, wherein the first metal film and the second metal film have a substantially similar material composition.

6. The method of claim 4, wherein the etching adjusts at least one of: a surface morphology of a surface of the first metal film and a nucleation characteristic of a surface of the first metal film.

7. The method of claim 6, wherein etching the first metal film includes etching using a fluorine etch.

8. The method of claim 1, wherein depositing the second metal film includes a low-temperature deposition.

9. A method of forming a semiconductor device, the method comprising:
   providing a substrate with at least one insulating layer disposed thereon, the at least one insulating layer including a trench;
   forming at least one liner layer on the at least one insulating layer;
   forming a nucleation layer on the at least one liner layer;
   forming a first metal film on a surface of the nucleation layer to fill the trench;
   etching the first metal film; and
   depositing a second metal film directly onto the etched surface of the first metal film, above an upper surface of the substrate and the upper surface of the trench, the second metal film substantially forming an overburden above the trench and contacting the first metal film,
   wherein depositing the second metal film includes a low-temperature deposition, and wherein a material grain size of the second metal film is less than a material grain size of the first metal film.

10. A method of forming a semiconductor device, the method comprising:
    forming at least one liner layer on an insulating layer of a semiconductor device, the insulating layer including a trench;
    forming a nucleation layer on the at least one liner layer;
    forming a first metal film on a surface of the nucleation layer to at least partially fill the trench, wherein an upper surface of the first metal film is partially positioned above an upper surface of the trench; and
    forming an overburden on the first metal film by performing a low temperature deposition of a second metal film directly onto the first metal film, wherein the overburden includes the second metal film positioned over and contacting the first metal film, wherein a material grain size of the second metal film is less than a material grain size of the first metal film.

11. The method of claim 10, further comprising:
    performing an etch to the first metal film following the forming the first metal film,
    wherein the etch adjusts at least one of: a surface morphology of a surface of the first metal film and a nucleation characteristic of a surface of the first metal film.

12. The method of claim 10, wherein the first metal film and the second metal film have a substantially similar material composition.

13. The method of claim 1, wherein the upper surface of the second metal film is substantially uniform, and wherein the upper surface of the first metal film is substantially non-uniform.

14. The method of claim 9, wherein a roughness of an upper surface of the second metal film is substantially uniform, and wherein an upper surface of the first metal film, before the etching of the first metal film, is substantially non-uniform.

15. The method of claim 1, wherein a material composition of the first metal film is different from a material composition of the second metal film.

16. The method of claim 9, wherein a material composition of the first metal film is different from a material composition of the second metal film.

17. The method of claim 10, wherein a portion of the trench is unfilled after the forming of the first metal film.

* * * * *

UNITED STATES PATENT AND TRADEMARK OFFICE
CERTIFICATE OF CORRECTION

| | | |
|---|---|---|
| PATENT NO. | : 9,230,857 B2 | Page 1 of 1 |
| APPLICATION NO. | : 14/522011 | |
| DATED | : January 5, 2016 | |
| INVENTOR(S) | : Hall et al. | |

It is certified that error appears in the above-identified patent and that said Letters Patent is hereby corrected as shown below:

Title page, Item (73) Assignee:

Delete:
"St. Microelectronics Inc"

Insert
-- STMicroelectronics, Inc. --

Signed and Sealed this
Nineteenth Day of April, 2016

Michelle K. Lee
*Director of the United States Patent and Trademark Office*